US006188583B1

United States Patent
Fendt et al.

(10) Patent No.: US 6,188,583 B1
(45) Date of Patent: Feb. 13, 2001

(54) CONTACT BRIDGE ARRANGEMENT FOR CONDUCTIVELY INTERCONNECTING CIRCUIT BOARDS

(75) Inventors: Guenter Fendt, Schrobenhausen; Richard Baur, Pfaffenhofen; Michael Bischoff, Adelschlag, all of (DE)

(73) Assignee: Temic Telefunken microelectronic GmbH, Heilbronn (DE)

(*) Notice: Under 35 U.S.C. 154(b), the term of this patent shall be extended for 0 days.

(21) Appl. No.: 09/211,459

(22) Filed: Dec. 14, 1998

(30) Foreign Application Priority Data

Dec. 18, 1997 (DE) .............................. 197 56 345

(51) Int. Cl.[7] .............................. H05K 1/14; H01R 9/09; H01R 31/08
(52) U.S. Cl. .......................... 361/796; 361/752; 361/784; 361/791; 361/803; 439/74; 439/510
(58) Field of Search ..................... 361/728, 736, 361/752, 753, 756, 784, 790, 791, 796, 801, 803; 439/74, 76.1, 507, 510, 511

(56) References Cited

U.S. PATENT DOCUMENTS

| Re. 35,231 | * | 5/1996 | Wilson | 439/76.1 |
|---|---|---|---|---|
| 4,200,900 | * | 4/1980 | McGeorge | 361/803 |
| 4,568,136 | * | 2/1986 | Reuss | 439/629 |
| 4,575,060 | | 3/1986 | Kitagawa . | |
| 4,679,872 | * | 7/1987 | Coe | 439/61 |
| 5,013,250 | * | 5/1991 | Schulz | 439/79 |
| 5,046,955 | * | 9/1991 | Olsson | 439/74 |
| 5,181,855 | * | 1/1993 | Mosquera et al. | 439/74 |
| 5,536,177 | * | 7/1996 | Casey | 439/74 |
| 5,548,486 | * | 8/1996 | Kman et al. | 361/791 |
| 5,575,686 | * | 11/1996 | Noschese | 439/620 |
| 5,772,452 | * | 6/1998 | Aoyama | 439/74 |
| 6,000,955 | * | 12/1999 | Zaderej | 439/79 |

FOREIGN PATENT DOCUMENTS

| 3444667 | 6/1986 | (DE) . |
|---|---|---|
| 3426005 | 9/1993 | (DE) . |
| 9321190 | 2/1998 | (DE) . |
| 9-213389 | 8/1997 | (JP) . |

* cited by examiner

Primary Examiner—Jayprakash N. Gandhi
(74) Attorney, Agent, or Firm—W. F. Fasse; W. G. Fasse

(57) ABSTRACT

A contact bridge arrangement in a housing of an electronic assembly provides a simplified electrical interconnection of circuit boards while avoiding the need of electrical plugs, sockets and connector cables for connecting the circuit boards. The contact bridge includes an insulating block provided on the floor of the housing, and a plurality of conducting connectors embedded in the insulating block. First electrical contacts, such as contact pads with holes therein, are provided on the circuit boards, and engage the second electrical contacts in the form of contact pins provided by the free ends of the conducting connectors protruding from the insulating block. Assembling the arrangement simply requires pressing the circuit boards onto the contact pins of the contact bridge. The insulating block of the contact bridge may have a step configuration providing two offset flat support surfaces on which two circuit boards may be supported one above the other with a spacing therebetween.

22 Claims, 1 Drawing Sheet

CONTACT BRIDGE ARRANGEMENT FOR CONDUCTIVELY INTERCONNECTING CIRCUIT BOARDS

PRIORITY CLAIM

This application is based on and claims the priority under 35 U.S.C. §119 of German Patent Application 197 56 345.7, filed on Dec. 18, 1997, the entire disclosure of which is incorporated herein by reference.

FIELD OF THE INVENTION

The invention relates to an arrangement for electrically contacting and conductively interconnecting at least two circuit boards arranged in a housing.

BACKGROUND INFORMATION

Conventionally, plug-in connections are used for electrically interconnecting different circuit boards that are typically arranged within a housing of an electronic assembly or module. Each such conventional plug-in connection is formed by a respective multi-conductor connector plug and a corresponding multi-conductor connector socket that are each respectively arranged on or connected to one of the circuit boards. In cases in which two circuit boards that are to be interconnected are in direct proximity to each other, it is commonplace to arrange the plug directly on one circuit board and the corresponding socket directly on the other circuit board so that no connector cable is needed. However, in situations in which the two circuit boards are located spaced apart from one another, the plug and/or the socket are connected to the associated circuit board by means of an interposed connector cable. The interconnection is completed by plugging the plug into the socket.

The above described approaches for electrically interconnecting circuit boards with each other suffer several disadvantages. First of all, the circuit boards and the overall electronic assembly are made significantly more expensive due to the additional costs of the plug connection and the connector cables wherever applicable. Secondly, such connections are not very reliable, especially because each connection path can involve several independent connections in series, between the first circuit board and the first connector cable, between the first connector cable and the socket, between the socket and the plug, between the plug and a second connector cable, and between the second connector cable and the second circuit board. Whenever the use of a connector cable is to be avoided, i.e. the plug and socket are to be arranged directly on the circuit boards, then the dimensions of the circuit boards must be correspondingly increased to accommodate the dimensions of the plug and the socket, which accordingly entails additional costs and can cause the entire electronic assembly or module to have an increased size. Moreover, the assembly time and assembly costs are increased due to the necessary care and precision with which the plugs must be inserted into the sockets to complete the electrical interconnections.

SUMMARY OF THE INVENTION

In view of the above, it is an object of the invention to provide an arrangement for electrically contacting and conductively interconnecting circuit boards in a housing in a simple, low-cost, space saving, and reliable manner. The invention further aims to avoid or overcome the other disadvantages of the prior art, and to achieve additional advantages, as apparent from the present description.

The above objects have been achieved, according to the invention, in a contact bridge arrangement for conductively interconnecting at least two circuit boards that are provided with first electrical contacts and arranged in a housing. Further according to the invention, the contact bridge is arranged in the housing and includes at least one electrically conducting connector having two free ends that are each respectively embodied as second electrical contacts. To complete the electrical interconnection, the circuit boards are arranged relative to each other and relative to the contact bridge so that the second contacts of the conducting connector of the contact bridge respectively conductingly contact and preferably also mechanically engage the first contacts provided on the circuit boards.

Preferably, the first electrical contact of the circuit board is embodied as a contact pad while the second electrical contact of the contact bridge is embodied as a contact pin, or alternatively the first electrical contact of the circuit board is embodied as a contact pin while the second electrical contact of the contact bridge is embodied as a contact pad. The respective contact pins may each be a press-in contact pin that is engaged by a press fit into a mating hole provided in the associated contact pad of the other mating contact. Alternatively, each contact pin may comprise a spring contact that contacts and engages the mating contact pad with a spring engagement force.

According to preferred details of the invention, the contact bridge further includes a support bridge comprising a block of non-conducting material, i.e. electrically insulating material, that is preferably integrally formed with the housing. The conducting connector is preferably integrated into the insulating block, for example by being molded or cast therein. The insulating block may include coplanar support surfaces for respectively supporting two circuit boards that are arranged coplanar next to each other. In such an embodiment, each conducting connector is a substantially U-shaped conductor, of which the legs or shanks forming the contact pins have equal lengths. Alternatively, the insulating block includes two supporting surfaces on different parallel planes for respectively supporting two circuit boards that are not coplanar with one another, but instead are arranged one above another on respective parallel spaced planes. In such an embodiment, the conducting connector is a substantially J-shaped conductor, of which the two shanks or legs forming the contact pins have different lengths. In either embodiment, there may be two or more of the U-shaped or J-shaped conducting connectors arranged respectively nested one within the other to provide a compact arrangement of multiple parallel connections.

The arrangement according to the invention achieves several advantages, and most importantly avoids the need of providing plug and socket connections as well as connector cables for achieving the electrical interconnection of circuit boards within a housing. Moreover, the contacts and particularly the contact pads provided on the circuit boards take up a rather small space, so that the dimensions of the circuit boards and therewith the dimensions of the entire assembly can be reduced, resulting in corresponding cost savings. As a further advantage, the assembly is significantly simplified and made quicker and more reliable by avoiding the need to plug together a plug and a socket. Instead, the circuit board is simply pressed onto its positioning and support studs, whereby the contact pins of the contact bridge simultaneously are pressed and engaged into the contact holes of the contact pads of the circuit boards.

An additional advantage is that the present inventive arrangement requires a reduced or minimized number of individual parts to achieve the electrical interconnection of the circuit boards. This not only simplifies the assembly, but also simplifies the disassembly in the event of reprocessing or recycling the electronic module such as a control device. With the inventive arrangement, it is a simple matter to completely remove or disassemble all components and sort them according to the basic materials thereof, so that these materials can then be reused or recycled as a raw material.

BRIEF DESCRIPTION OF THE DRAWINGS

In order that the invention may be clearly understood, it will now be described in connection with example embodiments, with reference to the accompanying drawings, wherein.

DETAILED DESCRIPTION OF PREFERRED EXAMPLE EMBODIMENTS AND OF THE BEST MODE OF THE INVENTION

Figure 1:
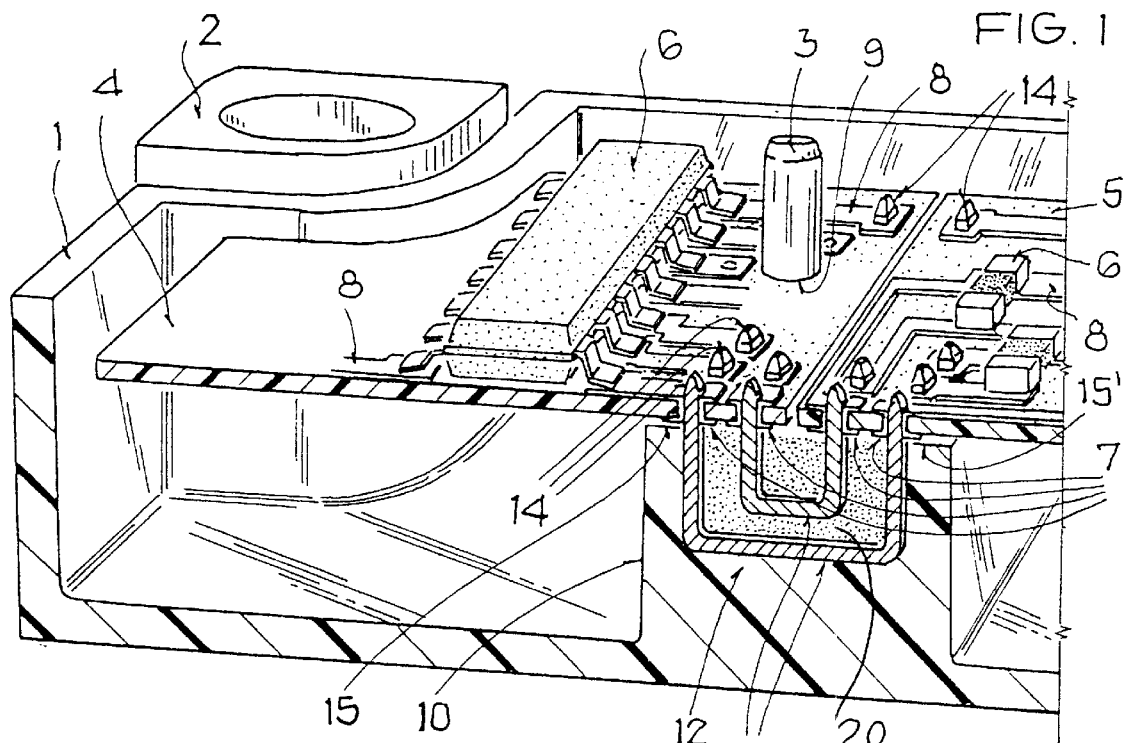
FIG. 1 schematically shows a sectioned perspective view of a portion of an electronic control device including a housing (without its cover) as well as two circuit boards that are electrically interconnected and arranged coplanar next to each other.
Figure 2:
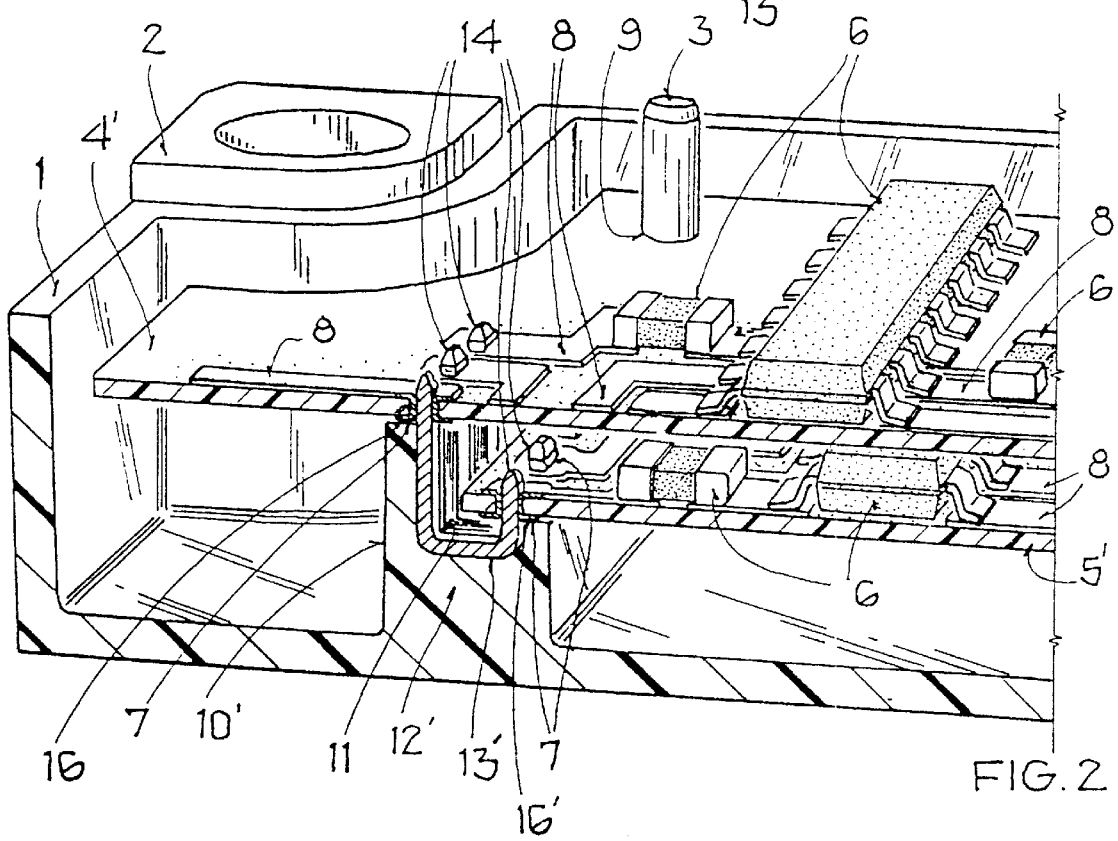
FIG. 2 is a schematic sectioned perspective view similar to that of FIG. 1, but showing a different embodiment of an electronic control device in which two circuit boards that are to be electrically interconnected are arranged stacked and spaced one above the other.

FIGS. 1 and 2 both show examples of the inventive contact bridge arrangement as used in an electronic assembly, such as an electronic control device like a triggering circuit module for an occupant safety system in a motor vehicle, for example. The electronic assembly or control device generally comprises a housing 1 made of plastic or the like, two circuit boards 4 and 5, or 4' and 5' arranged in the housing 1, and a contact bridge arrangement 10 or 10' provided in the housing.

The housing 1 includes a housing wall enclosing a housing cavity therein, and securing tabs or lugs 2 by which the housing 1 may be secured to the motor vehicle by means of screws, rivets or the like. The housing 1 may be closed and sealed by a cover plate in its final assembled condition, but such a cover plate is omitted from the drawings for purposes of clarity. The housing 1 further includes rod or pin-shaped mounting studs 3 on which the circuit boards 4, 4', 5, 5' are mounted; namely the studs 3 pass through mounting holes 9 provided in the circuit boards. The position of each circuit board is fixed in two directions in the horizontal plane by the lateral location of the respective stud 3 cooperating with the corresponding mounting hole 9, and the height of the circuit board in the vertical direction is fixed by a step or shoulder provided on each stud 3, such that the circuit board rests on this step or shoulder. To permanently secure the circuit boards, these studs 3 may be caulked or riveted, for example by a thermal riveting or upsetting process.

Various electronic components 6 as well as contact pads 7 provided with contact holes are arranged on each of the circuit boards 4, 4', 5, and 5' and are electrically interconnected to each other by conductor paths or traces 8 forming the desired circuit pattern. The contact pads 7 provided on the circuit boards are more generally representative of any first electrical contacts that could be provided on the circuit boards.

The contact bridge 10 or 10' provided in the housing 1 includes a block 12 or 12' of insulating material such as the plastic material of the housing 1, which is mounted on or protrudes integrally from the floor or bottom wall of the housing 1. In the present examples, the insulating block 12 or 12' is a substantially quadrilateral or parallelepiped block that has substantially flat planar support surfaces 15, 15', 16, and 16' on which the circuit boards 4, 4', 5, and 5' are respectively mechanically restingly supported. In each case, the support surfaces 15, 15', 16, and 16' are respectively arranged at the same corresponding height as the positioning and support shoulders or steps of the mounting studs 3.

In the particular embodiment of FIG. 1, the insulating block 12 has a substantially uniform quadrilateral or parallelepiped shape, with a groove in the top surface for receiving a plurality of conducting connectors 13 (as will be discussed in detail below) between the two support surfaces 15 and 15', which are arranged coplanar with each other, lying on the same plane as the two circuit boards 4 and 5 that are arranged coplanar and adjacent to each other at the same spacing or height above the floor of the housing 1.

On the other hand, in the particular embodiment according to FIG. 2, the insulating block 12' has a stepped cross-sectional shape that includes two flat support surfaces 16 and 16' offset from one another at different respective heights relative to the floor of the housing 1, with a step 11 between these two support surfaces 16 and 16'. In this embodiment, the two circuit boards 4' and 5' are arranged parallel to each other and partially overlapping one another, i.e. stacked with a spacing one above the other while the upper circuit board 4' protrudes laterally beyond the edge of the lower circuit board 5'. The two support surfaces 16 and 16' respectively support the circuit boards 4' and 5' in the vertical direction, and additionally the lower circuit board 5' is laterally located and supported against the vertical wall of the step configuration 11 of the block 12'.

It is also possible to arrange more than two circuit boards stacked one above the other while achieving a mechanical support and electrical interconnection according to the invention. In this case, it is simply necessary that the contact bridge 10' includes a corresponding plurality of height-stepped support surfaces for respectively supporting the several circuit boards. It is also possible that the contact bridge 10, 10' may have a different configuration than that shown in FIGS. 1 and 2. For example, the contact bridge 10, 10' may have the configuration of a typical roadway bridge or the like.

The above features relate to the mechanical support of the circuit boards 4, 4', 5 and 5' within the housing 1. In order to provide the electrical contact, i.e. the electrical interconnection between the circuit boards, the contact bridge 10, 10' further includes a plurality of conducting connectors 13, 13' respectively embedded in the insulating block 12, 12'. Each conducting connector 13, 13' includes a base or spine web and two legs or shanks extending therefrom. The conductor legs have free ends that protrude slightly out of the respective insulating block 12, 12', and particularly from the support surfaces 15, 15', 16 and 16', to form second electrical contacts embodied as contact pins 14.

The conducting connectors 13 in the embodiment of FIG. 1 have a U-shape in which the two conductor legs forming the contact pins have equal lengths. On the other hand, the conducting connector 13' in FIG. 2 has a J-shape in which the two conductor legs forming the contact pins 14 have different lengths. The protruding free ends of the contact pins 14 are embodied as simple press-in pins or as spring contacts or in any other manner known in the art, so that these protruding ends of the contact pins 14 can be electrically contacted with and preferably physically engaged with the contact pads 7 of the circuit boards 4, 4', 5 and 5' to provide a low-ohmic and durable electrical contact therebetween.

Another variation according to the invention is that the particular embodiments of the first and second electrical contacts can be exchanged or reversed with each other. Namely, the first electrical contacts provided on the circuit boards 4, 4', 5, and 5' can be embodied as contact pins while the second electrical contacts provided on the free protruding ends of the conducting connectors 13 and 13' can be embodied as contact pads. It is also possible that a respective conducting connector 13, 13' may have a contact pin at one free end thereof and a contact pad at the other free end thereof, as long as the respective circuit boards are provided with mating contact elements in each case.

Preferably, as shown in FIGS. 1 and 2, the insulating blocks 12 and 12' of the contact bridges 10 and 10' are respectively integrally formed in a single molding step with the housing 1, for example by means of injection molding the housing 1 with the block 12 or 12' formed thereon. Alternatively, the insulating blocks 12 and 12' can be produced separately from the housing 1 and then connected to the housing 1 by means of screwing, adhesive bonding, thermal welding, thermal riveting, mechanical catch or clamp mounting, or any other known manner. The conducting connectors 13 or 13' may be molded into the block 12 or 12' during the injection molding process, or may be afterwards set into grooves that were molded into the block, as shown in FIG. 2 for example. Furthermore, the interspaces around and between the conducting connectors 13 or 13' are preferably filled with a plastic or some other insulating filler material or casting or potting compound 20 as shown in FIG. 1. This is especially true when a plurality of the conducting connectors 13 are to be nested one within the other as shown in FIG. 1, to provide electrical interconnections at contact locations arranged in more than one row at different spacings from the edge of the respective circuit board.

For making the necessary electrical contacts or interconnections between the respective circuit boards 4, 4', 5, and 5', or for achieving the desired coding of the circuit, various embodiments or contact pin configurations of the contact bridges 10 and 10' are possible. For example, the contact bridges 10 and 10 can include a fixed plurality of the contact pins 14, which for some applications would be in excess of the number needed for providing the necessary interconnections. In such a case, only the necessary contact pads 7 are electrically connected or contacted by the conductor paths or traces 8 while the unneeded contact pads 7 are simply left unconnected in the circuit. Alternatively, the contact bridge 10 or 10' includes only the exact required number of contact pins 14 and the circuit boards 4, 4', 5, and 5' include only the exact required number and arrangement of the contact pads 7, all of which are connected to the conductor paths or traces 8. While the first alternative allows standardization and series mass production of the housing and contact bridge arrangement, the second alternative allows specialization and a unique configuration for a particular application so as to save space and unnecessary components.

The process of assembling the electronic module including the contact bridge arrangement according to the invention is very simple. The previously fabricated circuit boards 4, 4', 5 and 5' are simply laid into the housing 1 that has previously been fabricated to include the contact bridge 10 or 10' and the pin-shaped mounting studs 3. Specifically, the circuit boards 4, 4', 5 and 5' are simply positioned or aligned so that the respective locating holes 9 provided in the circuit boards are guided onto the respective studs 3. With this alignment, the contact pads 7 of the circuit boards are also aligned with and come into contact with the contact pins 14 of the contact bridge 10 or 10' so as to establish an electrically conducting contact therebetween.

If the free ends of the contact pins 14 are embodied as press-in pins, then the contact pads 7 preferably each have a hole therein which engages onto the free protruding end of the respective contact pin 14. Assembly in this case simply requires pressing the circuit boards 4, 4', 5 and 5' down onto the respective contact bridge 10 or 10' so that the contact pins 14 are correspondingly pressed into the contact holes of the contact pads 7 according to the generally known press-in technique, which provides a very durable low resistance contact. Alternatively, if the free ends of the contact pins 14 are embodied as spring contacts, then the circuit boards 4, 4', 5 or 5' must be pressed and held down against the respective contact bridge 10 or 10', for example by means of a hold-down clamp, a latch, a hook device, or a spacer member provided on the housing cover (not shown), so that the contact pads 7 are pressed against the spring contact ends of the contact pins 14 to provide a secure electrical contact. As a further alternative, a protruding contact pin or lug provided on the circuit board can be engaged in a spring slot provided on the end of the conducting connector 13 or 13' of the contact bridge 10 or 10'.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. An electronic assembly comprising:

a housing;

first and second circuit boards that respectively have first electrical contacts provided thereon and that are arranged spaced from one another respectively on different planes in said housing; and a contact bridge arrangement provided in said housing, comprising a support bridge having a first support surface on which said first circuit board is supported and a second support surface on which said second circuit board is supported, and a plurality of electrically conducting connectors that each have two respective free ends forming respective second electrical contacts;

wherein said second electrical contacts of said conducting connectors respectively make electrical contact with said first electrical contacts of said first and second circuit boards so as to electrically interconnect said first and second circuit boards with one another via said conducting connectors;

wherein said conducting connectors are arranged with said free ends protruding from said first and second support surfaces;

wherein said first and second support surfaces are offset from one another and are respectively arranged along said different planes; and wherein each one of said conducting connectors respectively comprises two conductor legs that respectively have different lengths, with said free ends being free ends of said conductor legs.

2. The electronic assembly according to claim 1, wherein said second electrical contacts respectively mechanically engage said first electrical contacts.

3. The electronic assembly according to claim 1, wherein said support bridge comprises a block of electrically insulating material.

4. The electronic assembly according to claim 3, wherein said conducting connectors are integrated into said block.

5. The electronic assembly according to claim 4, wherein said conducting connectors are substantially entirely embedded in said block except for said free ends that protrude out of said block.

6. The electronic assembly according to claim 4, wherein said conducting connectors are set into respective grooves provided on an outer surface of said block so that at least a portion of each said conducting connector extending between said free ends of said conducting connector remains exposed out of said block.

7. The electronic assembly according to claim 4, wherein at least exposed portions of said conducting connectors are exposed out of said block, and further comprising an insulating potting compound covering and embedding said exposed portions of said conducting connectors onto said block while leaving said free ends exposed.

8. The electronic assembly according to claim 4, wherein a first one of said conducting connectors is nested within a second one of said conducting connectors with a spacing therebetween.

9. The electronic assembly according to claim 8, further comprising an insulating potting compound that is provided in said spacing between said first and second conducting connectors and that at least partially embeds said conducting connectors therein.

10. The electronic assembly according to claim 1, wherein said first and second circuit boards are arranged laterally overlapping one another while being spaced from one another on said different planes, which are parallel to one another.

11. The electronic assembly according to claim 1, wherein said support bridge has a stepped cross-sectional shape with said first and second support surfaces offset from and parallel to one another, and with an offset step wall extending perpendicularly between said first and second support surfaces.

12. The electronic assembly according to claim 11, wherein an edge of said second circuit board is positioned along and contacts said offset step wall.

13. The electronic assembly according to claim 1, wherein each one of said conducting connectors respectively has a J-shape including a base web in addition to said two conductor legs, wherein said two conductor legs respectively protrude from respective opposite ends of said base web.

14. The electronic assembly according to claim 1, further comprising mounting studs that are provided in said housing and that each include a stud shaft with a support shoulder thereon, wherein said support shoulders of said mounting studs are respectively located on the same said plane on which at least one of said support surfaces is arranged, and wherein at least one of said circuit boards has mounting holes therein and is arranged resting on said support shoulders with said stud shafts passing through said mounting holes.

15. The electronic assembly according to claim 1, wherein said housing comprises a housing wall, and said support bridge is integrally formed with said housing wall so as to protrude from said housing wall into an interior space within said housing.

16. The electronic assembly according to claim 1, wherein said first electrical contacts respectively comprise contact pads and said second electrical contacts respectively comprise contact pins.

17. The electronic assembly according to claim 1, wherein said first electrical contacts respectively comprise contact pins and said second electrical contacts respectively comprise contact pads.

18. The electronic assembly according to claim 1, wherein either said first electrical contacts or said second electrical contacts respectively comprise press-in contact pins, and the other of said first electrical contacts or said second electrical contacts that do not comprise said press-in contact pins respectively comprise contact pads having contact holes therein, and said press-in contact pins are respectively pressed into said contact holes.

19. The electronic assembly according to claim 1, wherein either said first electrical contacts or said second electrical contacts respectively comprise spring contacts, and the other of said first electrical contacts or said second electrical contacts that do not comprise said spring contacts respectively comprise contact pads, and said spring contacts are respectively pressed into spring engagement with said contact pads.

20. The electronic assembly according to claim 1, wherein said two conductor legs are integrally formed and integrally connected with one another, and are respectively angled from one another so as to be offset from one another and parallel to one another.

21. The electronic assembly according to claim 1, wherein said first and second circuit boards are arranged one over another and parallel to one another respectively on said different planes, which are parallel planes.

22. The electronic assembly according to claim 1, wherein said free ends of said conducting connectors protrude straight and perpendicularly from said first and second support surfaces.

* * * * *